United States Patent

Chen

[11] Patent Number: 5,851,337
[45] Date of Patent: Dec. 22, 1998

[54] METHOD OF CONNECTING TEHS ON PBGA AND MODIFIED CONNECTING STRUCTURE

[75] Inventor: Shih-Li Chen, Hsinchu, Taiwan

[73] Assignee: Caesar Technology Inc., Hsinchu, Taiwan

[21] Appl. No.: 885,343

[22] Filed: Jun. 30, 1997

[51] Int. Cl.[6] .................................................. B32B 31/00
[52] U.S. Cl. .................................. 156/275.3; 156/275.5; 156/275; 174/51; 174/52.1; 257/675; 257/712; 257/720; 361/712; 361/714; 361/720
[58] Field of Search ................................ 257/675, 690, 257/712, 720; 174/51, 52.1; 361/712, 714, 720, 722, 723, 813, 772; 156/150, 151, 275.3, 275.5, 275.7

[56] References Cited

U.S. PATENT DOCUMENTS

| | | | |
|---|---|---|---|
| 3,665,256 | 5/1972 | Goun | 257/675 X |
| 4,999,136 | 3/1991 | Su et al. | |
| 5,583,377 | 12/1996 | Higgins III | 361/712 X |

*Primary Examiner*—Jeff H. Aftergut

[57] ABSTRACT

A method for connecting TEHS to PBGA and a modified connecting structure for TEHS and PBGA are disclosed. The structure improves both heat dissipation efficiency of PBGA by TEHS with high heat conductivity and electrical performance of PBGA by TEHS which is electrically connected to the circuit in PBGA substrate. There are two methods of connecting TEHS to PBGA, including metallic soldering and nonmetallic adhesion. In the metallic soldering, the contact region of the TEHS is covered with a layer of solder tin and soldered to metallic contact region of the growing circuit in the substrate. In the nonmetallic adhesion, the metallic contact region of the growing circuit is covered with a layer of conductive resin. The TEHS is adhered and fixed to the metallic region by curing the conductive resin. Such two methods achieve that the TEHS is completely connected to the ground circuit in the substrate and the inductance of the whole device is reduced to decrease the noise which is generated by the inductance, and further to improve the quality of high speed transmission. Modified structures for soldering TEHS are also provided to reduce the concentration of stress.

20 Claims, 3 Drawing Sheets

METHOD OF CONNECTING TEHS ON PBGA AND MODIFIED CONNECTING STRUCTURE

FIELD OF THE INVENTION

The present invention relates to a plastic ball grid array (PBGA), and more particularly, to a method for manufacturing a thermal electrical enhanced heat spreader/slug (TEHS) on the PBGA and a modified solder structure for the TEHS.

BACKGROUND OF THE INVENTION

PBGA is one of the IC package techniques available for a chip, which has high density of input/output pins, especially more than 208 pins. PBGA may improve heat dissipation and printed circuit board (PCB) layout for the pins. The PBGA includes a chip with aluminum bonding pads beneath a substrate, which has a high density circuit pattern for connecting to input/output of the chip. The aluminum bonding pad is connected to a bonding finger of the substrate by wire bonding or soldering with a highly conductive metal. The circuit on the substrate is connected to a solder ball lead and further soldered and fixed on a main PCB. PBGA with an electrical conductive heat sink which is connected to the ground circuit on the substrate not only increases the rate of heat dissipation but also improves the quality of signal transmission. Such a heat sink possessing function of heat dissipation and electrical conductivity is called TEHS.

TEHS is electrically conductive and needs a completely clean surface to sustain conductivity. A layer of anti-oxidation such as solder tin, gold, or palladium is used to cover the surface of the TEHS in connecting region to obtain stable electrical conductivity. Because the thermal expansion coefficients of TEHS and PBGA materials are basically different, a connecting medium with elasticity is desired to avoid breakage due to stress concentration in the connecting region during heating and cooling processes. Epoxy resin with silver particle filler as well as other electrical conductive resins or metallic material such as solder tin are commonly used as the connecting medium. Both inner and outer sides of the TEHS connecting pin are connected to the ground circuit on the substrate to maintain connectivity for TEHS and the substrate when the TEHS moves.

There is no TEHS PBGA in mass production at present. Oxidation of TEHS conductive material may result in unstable contact property of connecting regions for TEHS and PBGA. Even bad contact will happen. This problem may be overcome by special tooling, but the cost is increased and the production volume is low.

SUMMARY OF THE INVENTION

An object of the present invention is to provide a method for connecting TEHS in PBGA to the circuit on the substrate with an elastic connecting medium in order to reduce the stress concentration due to thermal expansion.

Another object of the present invention is to provide a metallic connecting medium for connecting TEHS on PBGA to form a connecting region having metallic surface.

An further object of the present invention is to provide a nonmetallic connecting medium with high electrical conductivity and good adhesive property for connecting TEHS.

Another object of the present invention is to provide a modified connecting structure for connecting TEHS to the substrate with an elastic connecting medium in order to reduce the stress concentration due to thermal expansion.

Another object of the present invention is to provide a connecting structure with a metallic connecting medium for connecting TEHS on PBGA to the circuit on the substrate in order to form a connecting region having metallic surface.

A further object of the present invention is to provide a connecting structure with a nonmetallic connecting medium with high electrical conductivity and good adhesive property for connecting TEHS.

Other features and advantages of the present invention will become apparent from the following description which refers to the accompanying drawings.

DETAILED DESCRIPTION OF THE PREFERRED EMBODIMENTS

Figure 1:
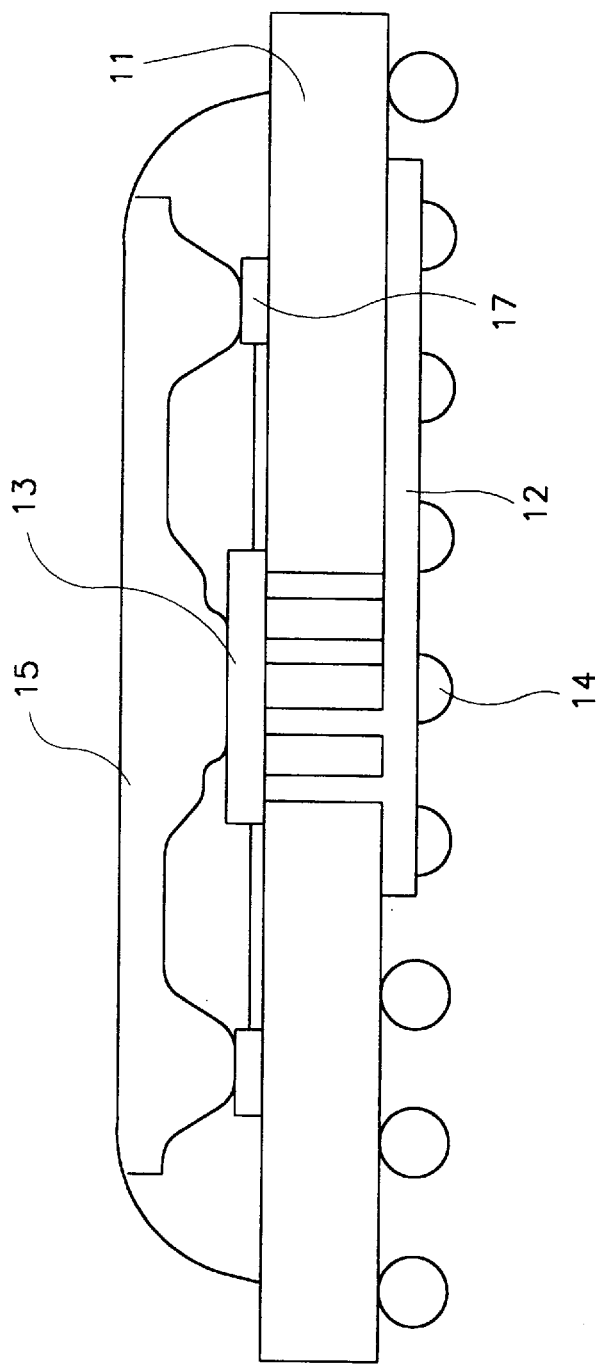
FIG. 1 shows a schematic diagram for a PBGA with TEHS in the present invention.

With reference to FIG. 1, a schematic diagram illustrates the structure of PBGA with an exposed type of TEHS in the present invention. The other type of TEHS, which is embedded in the PBGA, is not shown in the figure, but has the same structure except the shape of the TEHS without exposing. The whole structure of PBGA commonly comprises a substrate 11, a ground circuit 12, a chip 13, a BGA (Ball Grid Array) 14, and a TEHS 15. The connecting region 17 for the TEHS 15 and the substrate 11 has two types of structure, including nonmetallic and metallic.

Figure 3:
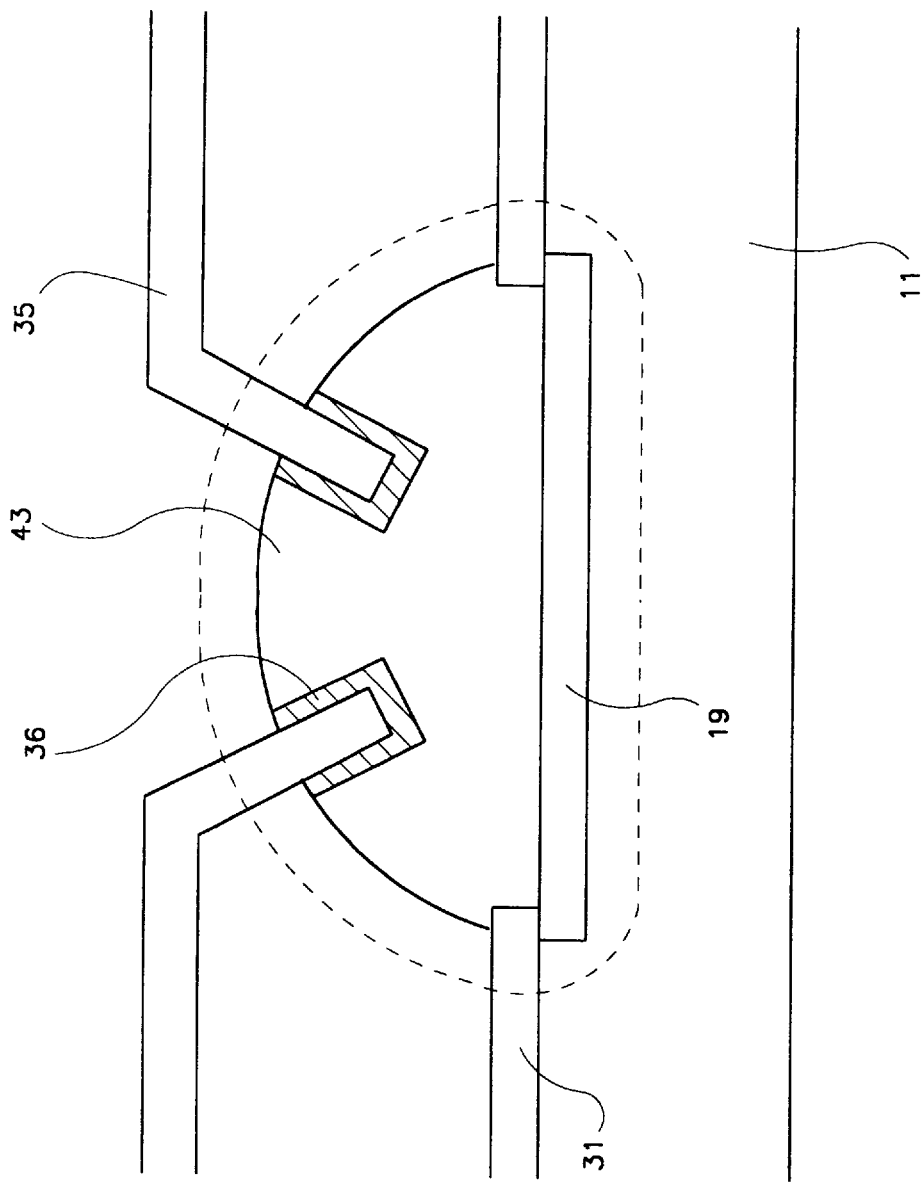
FIG. 3 illustrates a nonmetallic connecting structure for TEHS in accordance with the present invention.

With reference to FIG. 3, the nonmetallic structure for the connecting region 17 in the present invention comprises a substrate 11, a metallic conductor layer 19, a solder protection layer 31, a nonmetallic adhesive 43, a TEHS 35, and an anti-oxidation layer 36. The connecting part of the TEHS 35 is covered with the anti-oxidation layer 36 against oxidation with oxygen or vapor in the air for the TEHS during the manufacturing process. The nonmetallic adhesive 43 is used as a connecting medium to fix the TEHS 35 on the substrate 11 by heating, exposing to ultraviolet ray, or curing treatment. It is noted that the TEHS 35 in FIG. 3 is the same as the TEHS 15 in FIG. 1.

Figure 2:
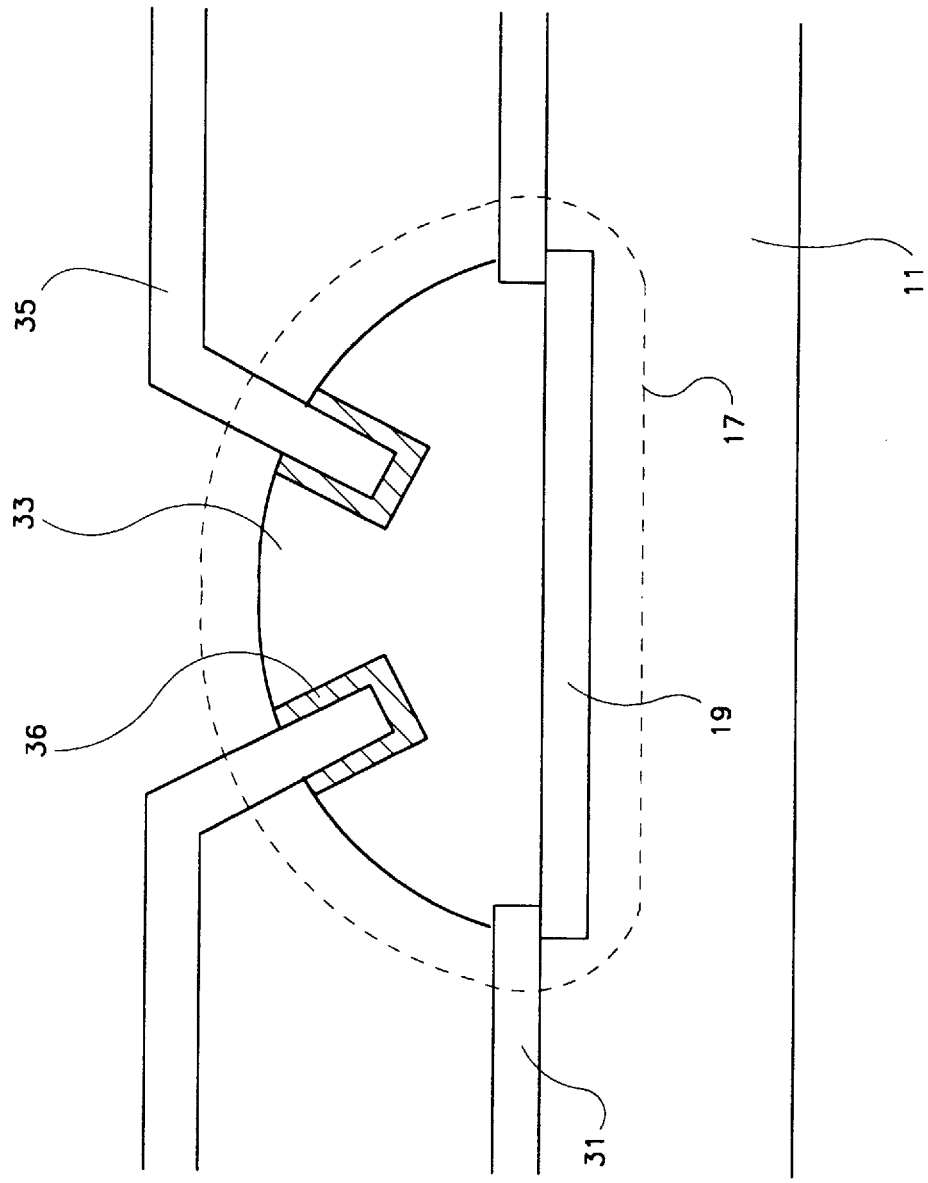
FIG. 2 illustrates a metallic connecting structure for TEHS in accordance with the present invention.

With reference to FIG. 2, a metallic connecting structure for TEHS in accordance with the present invention comprises a substrate 11, a solder protection layer 31, a metallic solder layer 33, a TEHS 35, and an anti-oxidation layer 36. The structure is the same as that in FIG. 3 except that the metallic solder layer 33 takes place of the nonmetallic adhesive 43.

The connecting part of the TEHS is manufactured by mold compression to compress a metallic plate to form depressions in appropriate places. The hollow connecting part of the TEHS is formed by polishing the bottom of the depression or is directly constructed in the mold compression process. The hollow structure is used to allow the conductive connecting medium to spread into such that mechanical strength is reinforced and breakage due to stress expansion is avoided.

The process for manufacturing the above nonmetallic structure for PBGA and TEHS, comprises:

(1) covering an anti-oxidation layer 36 over the connecting part of the TEHS 35 by electrically depositing or coating;

(2) covering the nonmetallic adhesive 43 over the exposed metallic conductive layer 19 of the ground circuit on the substrate 11 and the solder layer in the neighborhood;

(3) connecting the connecting part of the TEHS to then metallic conductive layer 19 on the substrate 11;

(4) curing the nonmetallic connecting medium by heating, exposing to ultraviolet ray, or other treatments to fix the TEHS 35 on the substrate 11.

The process for the metallic structure, comprises:

(1) covering an anti-oxidation layer 36 over the connecting part of the TEHS 35 by electrically depositing or coating;

(2) covering the solder tin 33 over the TEHS;

(3) connecting the connecting part of the TEHS to the metallic conductive layer 19 on the substrate 11 and coating a layer of solder paste if necessary;

(4) soldering and cooling the soldering tin 33.

In the process of manufacturing TEHS, the back of the TEHS usually undergoes an oxidation or anode-electrode treatment, or is coated with a layer of insulation material to avoid the TEHS from contacting the wires or the conductor to result in short-circuit. However the TEHS in the present invention has to be electrically connected to the growing circuit on the substrate, so the insulation layer over the TEHS has to be removed to obtain sufficient conductivity with the ground circuit. There are two methods for maintaining the conductivity of the connecting region. The first method is to cover a layer of insulation material over the TEHS, remove the connecting part of insulation layer or cut away the connecting part of the TEHS, and then cover a layer of anti-oxidation conductive material over exposed part by electrical depositing or coating method to guarantee electrical conductivity and power of anti-oxidation. The second method is to cover a layer of insulation material which is easily removed from the connecting region, cover a layer of another insulation material over the whole TEHS, remove the insulation layer which is easily removed, and then cover a layer of anti-oxidation conductive material over exposed part.

The modified connecting structure in accordance with the present invention may strengthen the power of protection against oxidation for the connecting part of the TEHS and improve contact property between the TEHS and the substrate in order to reduce the residual stress in the connecting region after connecting treatment and to enhance mechanical strength and increase production yield.

Although only the preferred embodiments of this invention were shown and described in the above description, it is requested that any modification or combination that comes within the spirit of this invention be protected.

What is claimed is:

1. A method for connecting a TEHS to a PBGA, comprising the steps of:

(a) preparing a TEHS having connecting parts;
    (b) forming hollow structures in said connecting parts;
    (c) preparing a PBGA based on a substrate having connecting regions;
    (d) covering a layer of thermally conductive elastic connecting medium over said connecting regions;
    (e) connecting said connecting parts of said TEHS to said connecting regions of said substrate by means of the layer of said connecting medium, the hollow structures in said connecting parts being filled with a portion of said connecting medium; and
    (f) treating said connecting medium appropriately for forming an elastic connecting structure.

2. The method according to claim 1, said connecting parts comprising hollow connecting pins.

3. The method according to claim 1, said elastic connecting medium comprising a non-metallic adhesive.

4. The method according to claim 1, said substrate further comprising a circuit having a part exposed in said connecting regions, said elastic connecting medium being thermally as well as electrically conductive, and said connecting parts of said TEHS, being electrically and thermally connected to the exposed part of the circuit of said substrate.

5. The method according to claim 4, said connecting parts comprising hollow connecting pins.

6. The method according to claim 4, said elastic connecting medium comprising a non-metallic adhesive.

7. The method according to claim 4, said elastic connecting medium comprising a resin having silver particle filler.

8. The method according to claim 7, wherein treating said elastic connecting medium comprises heating, exposing ultraviolet and curing.

9. The method according to claim 4, said elastic connecting medium comprising solder tin.

10. The method according to claim 9, wherein treating said elastic connecting medium comprises thermal soldering and cooling.

11. The method according to claim 4, further comprising a step of coating an electrically conductive anti-oxidation layer on said connecting parts of said TEHS.

12. A connecting structure for connecting and fixing a TEHS to a substrate of a PBGA, comprising:

a plurality of connecting parts of said TEHS, said connecting parts having hollow structures;
    a connecting region of said substrate; and
    a thermally conductive elastic connecting medium connecting said connecting parts of said TEHS to said connecting region of said substrate, said hollow structure in said connecting parts being filled with a portion of said connecting medium.

13. The connecting structure according to claim 12, said connecting parts comprising hollow connecting pins.

14. The connecting structure according to claim 12, said elastic connecting medium comprising a non-metallic adhesive.

15. The connecting structure according to claim 12, said substrate further comprising a circuit having a part exposed in said connecting regions, said elastic connecting medium being thermally as well as electrically conductive, and said connecting parts of said TEHS being electrically and thermally connected to the exposed part of the circuit of said substrate.

16. The connecting structure according to claim 15, said connecting parts comprising hollow connecting pins.

17. The connecting structure according to claim 15, said elastic connecting medium comprising a non-metallic adhesive.

18. The connecting structure according to claim 15, said elastic connecting medium comprising a resin having silver particle filler.

19. The connecting structure according to claim 15, said elastic connecting medium comprising solder tin.

20. The connecting structure according to claim 15, said connecting parts of said TEHS further comprising a coating of an electrically conductive anti-oxidation layer.

\* \* \* \* \*